(12) United States Patent
Prost et al.

(10) Patent No.: US 11,959,953 B2
(45) Date of Patent: Apr. 16, 2024

(54) DEVICE FOR REVEALING SPATIAL VARIATIONS IN THE POLARISATION OF ELECTROMAGNETIC RADIATION

(71) Applicants: OFFICE NATIONAL D'ETUDES ET DE RECHERCHES AÉROSPATIALES, Palaiseau (FR); CENTRE NATIONAL D'ETUDES SPATIALES C N E S, Paris (FR); UNIVERSITE TOULOUSE III—PAUL SABATIER, Toulouse (FR); CENTRE NATIONAL DE LA RECHERCHE SCIENTIFIQUE—CNRS, Paris (FR)

(72) Inventors: Daniel Prost, Toulouse (FR); Maxime Romier, Cugnaux (FR); Daniel Belot, Leguevin (FR); Patrice Simon, Toulouse (FR); Kévin Brousse, Toulouse (FR); Pierre-Louis Taberna, Toulouse (FR)

(73) Assignees: OFFICE NATIONAL D'ETUDES ET DE RECHERCHES AÉROSPATIALES, Palaiseau (FR); CENTRE NATIONAL D'ETUDES SPATIALES C N E S, Paris (FR); UNIVERSITE TOULOUSE III—PAUL SABATIER, Toulouse (FR); CENTRE NATIONAL DE LA RECHERCHE SCIENTIFIQUE—CNRS, Paris (FR)

( * ) Notice: Subject to any disclaimer, the term of this patent is extended or adjusted under 35 U.S.C. 154(b) by 206 days.

(21) Appl. No.: 17/762,987

(22) PCT Filed: Sep. 16, 2020

(86) PCT No.: PCT/FR2020/051601
§ 371 (c)(1),
(2) Date: Mar. 23, 2022

(87) PCT Pub. No.: WO2021/058895
PCT Pub. Date: Apr. 1, 2021

(65) Prior Publication Data
US 2022/0413028 A1    Dec. 29, 2022

(30) Foreign Application Priority Data

Sep. 24, 2019   (FR) ...................................... 19 10495

(51) Int. Cl.
*G01R 29/08*   (2006.01)
*G01J 5/00*   (2022.01)

(52) U.S. Cl.
CPC .. *G01R 29/0885* (2013.01); *G01J 2005/0077* (2013.01)

(58) Field of Classification Search
CPC ..................... G01R 29/0885; G01J 2005/0077
See application file for complete search history.

(56) References Cited

U.S. PATENT DOCUMENTS

2019/0242755 A1   8/2019   Lee et al.

FOREIGN PATENT DOCUMENTS

| FR | 2 787 583 | 6/2000 |
|---|---|---|
| FR | 2 959 355 | 10/2011 |

OTHER PUBLICATIONS

International Search Report and Written Opinion of the ISA for PCT/FR2020/051601, dated Mar. 19, 2021, 13 pages.
(Continued)

*Primary Examiner* — Hugh Maupin
(74) *Attorney, Agent, or Firm* — NIXON & VANDERHYE

(57) ABSTRACT

A device is suitable for revealing spatial variations in polarization of an electromagnetic radiation, in a form of
(Continued)

localized temperature variations. The device includes a surface of a carrier which is electrically and thermally insulating, and includes an array of patterns which each consist of at least one rectilinear segment of a sensitive material, of which the orientation is variable within each pattern or between neighboring patterns. Such device may be used with a thermal camera to reveal, in infrared images, temperature variations which are localized at segments not perpendicular to a local direction of linear polarization of the radiation.

20 Claims, 6 Drawing Sheets

(56) References Cited

OTHER PUBLICATIONS

Faure et al., "Electromagnetic Field Intensity Imaging by Thermofluorescene in the Visible Range", Physical Review Applied, vol. 11, No. 5, May 1, 2019, 12 pages.
Ragazzo et al., "11 Thermo-fluorescent images of electric and magnetic near-fields of a High Impedance Surface", 2019 International Symposium on Electromagnetic Compatibility—EMC Europe, IEEE, Sep. 2, 2019, pp. 257-260.
Norgard, "Infrared/Microwave Correlation Measurements", Optical Engineering, Soc. of Photo-Opitcal Instrumentation Engineers, vol. 33, No. 1, Jan. 1, 1994, 12 pages.

DEVICE FOR REVEALING SPATIAL VARIATIONS IN THE POLARISATION OF ELECTROMAGNETIC RADIATION

This application is the U.S. national phase of International Application No. PCT/FR2020/051601 filed Sep. 16, 2020 which designated the U.S. and claims priority to FR 19 10495 filed Sep. 24, 2019, the entire contents of each of which are hereby incorporated by reference.

BACKGROUND OF THE INVENTION

Field of the Invention

The present description relates to a device for revealing spatial variations in the polarization of an electromagnetic radiation, as well as a method for manufacturing such device.

Description of the Related Art

It is sometimes useful to characterize an electromagnetic radiation, particularly within the spectral range referred to as the microwave frequency, not only by its intensity, but also by the vector orientation of its electric field or of its magnetic field. It is known that the vector orientation of the electric field or magnetic field of a radiation corresponds to its polarization. This may be linear, circular, or elliptical, depending on the respective amplitudes of two components of the field along fixed vectors, and on the phase difference which exists between these two components. It is known that the cases of linear and circular polarizations are specific cases of elliptical polarizations, which are not necessarily strictly implemented.

Document FR 2 787 583 describes using a two-dimensional carrier which is transparent or substantially transparent to the electromagnetic radiation to be characterized, and which comprises on one of its surfaces a periodic array of parallel strips of a photothermal material. This photothermal material is subject to heating under the effect of the electromagnetic radiation, either due to Joule effect or to a mechanism of dielectric losses or to a mechanism of magnetic losses. However, due to the distribution of the photothermal material in parallel strips on the two-dimensional carrier, its heating capacity is anisotropic as a function of the direction of the electric or magnetic field to which the material is sensitive: for electromagnetic radiation which is linearly polarized, this heating is maximal when the direction of linear polarization of the field to which the photothermal material is sensitive is parallel to the strips. The heating of the photothermal material is revealed by thermography, for example using an infrared image sensor on which is formed an image of the two-dimensional carrier provided with the strips of the photothermal material. However, the detector thus formed, which is sensitive to the direction of the field of electromagnetic radiation, does not allow detecting spatial variations in the polarization of the electromagnetic radiation.

Based on this situation, an object of the invention is to propose a new detector sensitive to the field direction of an electromagnetic radiation, and which makes it possible to reveal spatial variations in the polarization of electromagnetic radiation.

An ancillary object of the invention is to provide such a detector having high sensitivity and being inexpensive to manufacture.

SUMMARY OF THE INVENTION

To achieve at least one of these or other objects, a first aspect of the invention proposes a new device suitable for revealing spatial variations in the polarization of an electromagnetic radiation, in the form of localized temperature variations. This device comprises a surface of a carrier which is thermally and electrically insulating, and comprises, in or on this surface of the carrier, an array of patterns which each consist of at least one rectilinear segment, preferably at least two rectilinear segments, of a material referred to as sensitive material. This sensitive material is suitable for producing heat when it is exposed to an electric field or to a magnetic field of the radiation, with a value of a ratio of heating power to electromagnetic radiation power which varies according to the polarization of the electromagnetic radiation relative to an orientation of each segment in the surface of the carrier. In addition, this ratio of heating power to electromagnetic radiation power is zero or substantially zero in the carrier outside of the segments of the sensitive material, regardless of the radiation polarization. The sensitive material which is thus defined may correspond in particular to a photothermal material as mentioned above.

According to a first feature of the invention, if each pattern comprises several segments, these segments have at least two orientations which are different within each pattern. Alternatively, if each pattern comprises only one segment, the segments of two neighboring patterns have different orientations. In other words, the rectilinear segments of sensitive material have orientations that are different within each pattern, or between separate neighboring patterns. Thus, segments whose orientations are different are each more sensitive to a linear polarization component of the radiation which is different than that for which another segment exhibits maximal sensitivity.

According to a second feature of the invention, the array is comprised of repetitions of a basic pattern with offsets in several different directions of repetition in the surface of the carrier, so as to form a two-dimensional array of identical patterns. Thus, when the patterns individually comprise several segments, each pattern constitutes a local detector which is separate from the other patterns, in or on the surface of the carrier, and which is sensitive to the direction of polarization of the electromagnetic radiation as it exists at the location of this pattern. Variations in heating which appear between different patterns then reveal spatial variations in the polarization of the electromagnetic radiation, as these spatial variations in the polarization exist at a given moment at the surface of the carrier. Otherwise, when each pattern only contains one segment, at least two neighboring patterns must be combined in order to constitute a local detector of the direction of polarization.

According to a third feature of the invention, the sensitive material is an electrically conducting material, with an electrical conductivity value of this sensitive material which is between 10 S/m (siemens per meter) and 500 S/m.

In general, the array of patterns in or on the surface of the carrier may be regular or random.

A device according to the invention has the following advantages:

- it makes it possible to identify the direction of polarization of the electromagnetic radiation which is locally effective, when this polarization is linear. For an elliptical polarization, it makes it possible to evaluate the level of ellipticity which is locally effective;
- it can provide a two-dimensional map of the polarization of the electromagnetic radiation;

the carrier provided with patterns may be large in size, possibly up to several square meters, giving access to maps of polarization in large surfaces;

the device is effective for electromagnetic radiation frequencies which can vary within a very wide range: from a few tens of hertz up to approximately 1 THz (terahertz) for a pattern material which is sensitive to the electric field, and up to approximately 1 GHz (gigahertz) for a pattern material which is sensitive to the magnetic field;

the electromagnetic radiation can be slightly altered by the device, in particular when the patterns cover a small fraction of the surface of the carrier. In particular, the device may generate almost no reflected radiation, so that measurements can be discreet and not interfere with the source of the radiation characterized using the device of the invention; and the device can make it possible to characterize details of the structure of the electromagnetic radiation, which have dimensions smaller than the wavelength of this radiation.

In particular embodiments of the invention, at least one of the following additional features may optionally and preferentially be reproduced, alone or in combinations thereof:

when each pattern comprises several rectilinear segments of sensitive material, these segments of each pattern may preferably have at least three different orientations in the surface of the carrier, inside the pattern. The direction of linear polarization can thus be determined unambiguously from each pattern;

the offsets of the repetitions of the basic pattern may be combined in two different directions of repetition in the surface of the carrier, and may be regular, so that the two-dimensional array of identical patterns is periodic in each of the two directions of repetition, with a spatial period in each of these directions of repetition which may be between 100 µm (micrometers) and 50 mm (millimeters), preferably between 1 mm and 30 mm. This spatial period corresponds to the resolution of the device in the corresponding direction of repetition, for determining spatial variations in the polarization of the electromagnetic radiation. Furthermore, the two directions of repetition of the patterns are not necessarily perpendicular. For example, they may form between them an angle of 60° (degrees). In this manner, the patterns can be distributed within the surface of the carrier according to an equilateral triangular array;

any two neighboring of the patterns in the surface of the carrier may be interlaced with one another. It is thus possible to obtain finer resolutions, for determining the spatial variations in the polarization of the electromagnetic radiation;

the segments of any pair of neighboring patterns in the surface of the carrier may be separated by an inter-pattern gap, which is devoid of sensitive material, between any one of the segments of a first pattern of the pair and any one of the segments of the other pattern of the pair. Interference with the pattern detection operation by a neighboring pattern is thus reduced;

any two segments of a same pattern may be insulated from each other by an intra-pattern gap which is devoid of sensitive material. Parasitic blending of pattern detection operations between perpendicular directions of linear polarization can thus be reduced;

each pattern may be composed of N segments arranged in the surface of the carrier, N being an integer which preferably may be between 3 and 16, the values 3 and 16 being included, and the respective orientations of the N segments of any one of the patterns may be uniformly distributed angularly. In particular, the segments of each of the patterns may be arranged radially around a center of the pattern, so as to form a regular N-pointed star in the surface of the carrier; and each segment may have a length which is between 50 µm and 40 mm, preferably between 1 mm and 30 mm, and a width which is between 10 µm and 500 µm, preferably between 100 µm and 300 µm, these lengths and widths being measured parallel to the surface of the carrier. The form factor values thus obtained for each segment provide good selectivity in the detection operation of this segment, between linear polarization components of the electromagnetic radiation which are respectively parallel and perpendicular to the segment.

In preferred embodiments of the invention, the surface of the carrier may be comprised of an organic material which is thermally and electrically insulating, for example based on polyimide. The sensitive material may then comprise at least one compound which results from an alteration of the organic material, in particular a compound from thermal degradation of the organic material. The device of the invention can thus have a particularly high sensitivity for detecting linear polarization components of electromagnetic radiation. It can also be manufactured in a simple and economical manner.

In general, the device may further comprise a thermal camera, which is arranged to capture infrared images of the surface of the carrier while this surface of the carrier is exposed to the electromagnetic radiation. It is thus possible to reveal, in the captured images, portions of at least some of the segments of sensitive material with intensities which depend on respective temperature values of these segment portions. However, other infrared thermography systems may alternatively be used.

According to an improvement of the invention, which is intended to further increase the sensitivity for detecting the polarization components of the electromagnetic radiation, in particular for detecting linear polarization components, the device may further comprise:

a modulation system, which is arranged to apply a temporal modulation sequence to the electromagnetic radiation to which the surface of the carrier is exposed;

a synchronous detection system, which is arranged to filter the intensities captured in successive images of the surface of the carrier, in accordance with the temporal modulation sequence; and an image processing system, designed to automatically determine the polarization features of the electromagnetic radiation at certain points of an image which has been captured, and possibly also to determine the intensity values of the electromagnetic radiation relating to these points.

A second aspect of the invention proposes a method for manufacturing a device suitable for revealing spatial variations in the polarization of an electromagnetic radiation, this method comprising the following steps:

providing a carrier, having a surface composed of a thermally and electrically insulating organic material, for example a material based on polyimide; and selectively heating the organic material in predefined zones of the surface of the carrier, for example by means of a laser beam which is directed into these zones, so as to locally alter the organic material to form the sensitive material, in particular by thermal degradation of the organic material, in order to constitute the segments of sensitive material.

Such manufacturing method is suitable for providing a device in accordance with the first aspect of the invention. However, other manufacturing methods are also possible, for example methods which comprise selective deposition of portions of the sensitive material at the locations of the patterns, and in accordance with the shape of the patterns.

BRIEF DESCRIPTION OF THE DRAWINGS

The features and advantages of the invention will become more clear in the following detailed description of non-limiting embodiments, with reference to the appended figures which include:

FIG. 5a and FIG. 5b are two diagrams which show magnitudes of the current densities induced in the device of FIG. 1, when this device is implemented with the pattern of FIG. 2a.

DESCRIPTION OF THE PREFERRED EMBODIMENTS

For clarity sake, the dimensions of the elements represented in these figures correspond neither to actual dimensions nor to actual dimension ratios. Furthermore, identical references indicated in different figures designate elements which are identical or which have identical functions.

Figure 1:
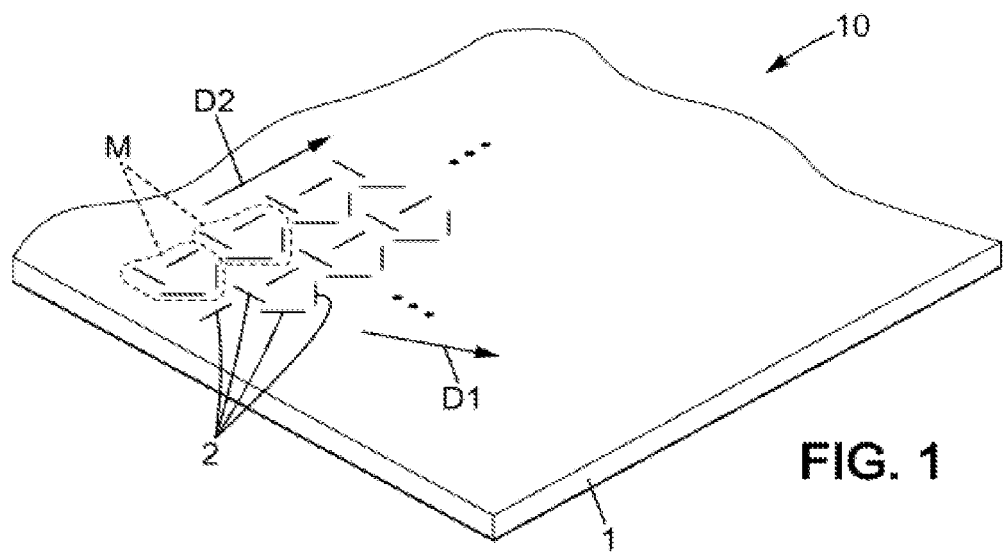
FIG. 1 is a perspective view of a device according to the invention.

In accordance with FIG. 1, a device 10 according to the invention comprises a surface of a carrier 1 which is electrically insulating, for example a film based on polyimide such as the one known by the name Kapton® film. The carrier 1 may have a thickness which is equal to about 100 µm (micrometers) for example. Preferably, the material of the carrier 1 has a thermal conductivity which is low or very low, such that it can be considered a thermal insulator. Furthermore, it is preferably transparent or substantially transparent to the electromagnetic radiation to be characterized using the device 10.

Patterns M of a material sensitive to electromagnetic radiation are distributed on a surface of the carrier 1. These patterns M are identical, so that they are each a reproduction of a basic pattern and form an array in the surface of the carrier 1. This array may or may not be periodic. When it is periodic, the patterns M may be offset relative to each other in any combination of two spatial periods respectively parallel to a first direction of repetition denoted D1 and to a second direction of repetition denoted D2. For example, the two spatial periods may be equal to 24 mm, in one non-limiting example.

Each pattern M is comprised of several rectilinear segments of the material sensitive to electromagnetic radiation, called the sensitive material, these having different orientations within the surface of the carrier 1. In general, each segment of the sensitive material may have a length which is between 50 µm and 40 mm, for example equal to 1 mm, and a width which is between 10 µm and 500 µm, for example equal to 200 µm, these segment lengths and widths being measured parallel to the surface of the carrier 1.

For example, FIG. 1 shows patterns M which are each composed of four rectilinear segments 2, their orientations parallel to the surface of the carrier 1 being offset by 45° (degrees) between any two segments of a same pattern M.

Figure 2A:
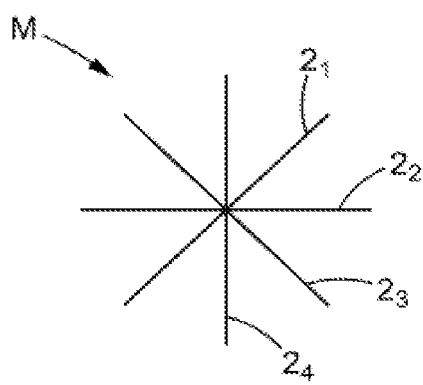
FIG. 2a to FIG. 2c show different patterns which alternatively may be used for the device of FIG. 1.

FIG. 2a shows another pattern M which may be used in the device of FIG. 1: the four rectilinear segments of the sensitive material of the pattern M are arranged to intersect at their middles, so as to form a regular eight-pointed star. The four segments of sensitive material which constitute the pattern M of FIG. 2a are denoted $2_1$, $2_2$, $2_3$, and $2_4$, and may each have a length equal to 20 mm.

Figure 2B:
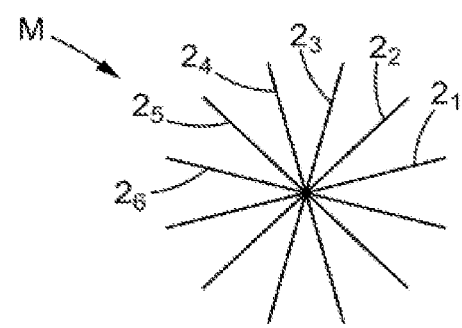

FIG. 2b shows yet another pattern M which may be used in the device of FIG. 1: it is composed of six rectilinear segments of sensitive material which are arranged to intersect at their middles, so as to form a regular twelve-pointed star. The six segments of sensitive material which constitute the pattern M of FIG. 2b are denoted $2_1$ to $2_6$. They may each also have a length equal to 20 mm.

Figure 2C:
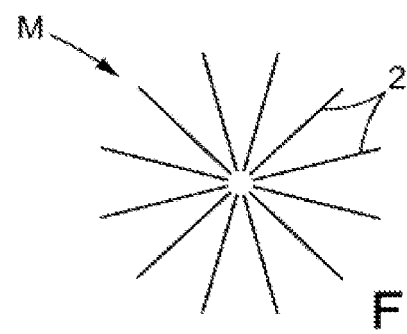

FIG. 2c shows a variant of pattern M of FIG. 2b, in which each rectilinear segment of the pattern of FIG. 2b is discontinued around its middle. The pattern M thus becomes comprised of twelve segments 2 which are detached from each other at the center of the regular twelve-pointed star. Each of the twelve segments 2 may then have an individual length equal to 8 mm, again as an example. Such patterns in which the points where the segments intersect are devoid of sensitive material make it possible to reduce the maximum value of the temperature measured for each pattern. It is thus possible to increase the dynamics of the temperature measurement for the segments which are thus separated.

Figure 3A:
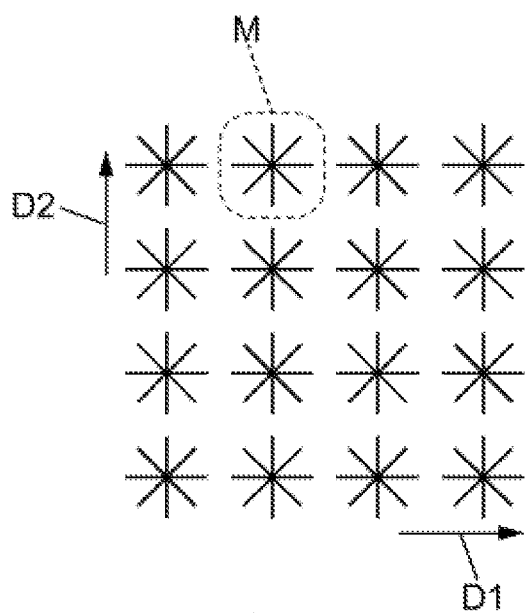
FIG. 3a to FIG. 3e show different pattern distributions which alternatively may be used for the device of FIG. 1.

FIG. 3a shows a first possible example of a distribution of patterns M in the surface of the carrier 1, for which the two directions of repetition D1 and D2 are perpendicular to each other. In the example shown, the two spatial periods in directions D1 and D2 are equal, but this is not essential. These spatial periods may be between 100 µm and 50 mm, preferably between 1 mm and 30 mm, for example equal to 25 mm.

Figure 3B:
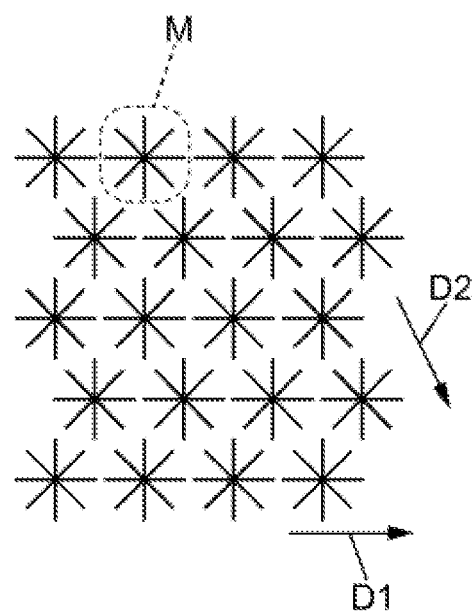

FIG. 3b corresponds to FIG. 3a, when the two directions D1 and D2 of repetition of the pattern M are not perpendicular to each other, but are oriented for example to be approximately 60° relative to each other.

In general, the compactness of the array of patterns M in the surface of the carrier 1 determines the spatial resolution in the characterization of the electromagnetic radiation provided by the device 10. Indeed, each pattern M is intended to separately provide a characterization of the electromagnetic radiation, concerning its polarization and possibly also its intensity, for the radiation as it exists at the location of the pattern M. For a periodic array, this spatial resolution is determined by the repetition periods of the pattern M in directions D1 and D2.

For all embodiments of the invention in which each pattern M comprises several rectilinear segments which have different orientations inside each pattern, each pattern M is sufficient for determining the polarization of the electromagnetic radiation at the location of this pattern, apart from the direction of rotation of this polarization when it is circular or elliptical. The spatial resolution of the device 10 is then substantially equal to the distance separating the respective centers of neighboring patterns in the surface of the carrier 1.

Figure 3C:
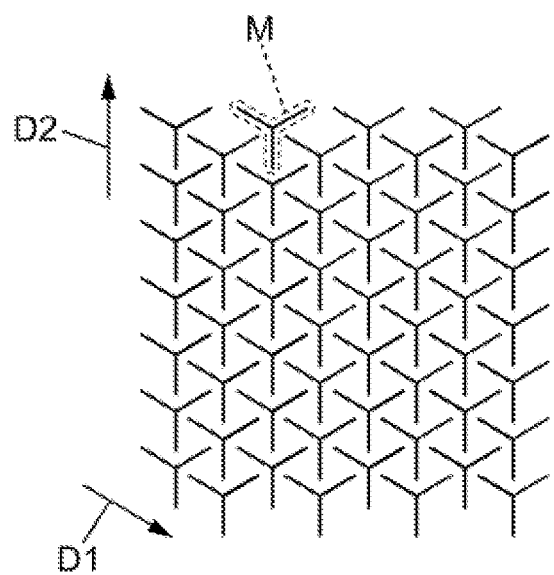

FIG. 3c shows yet another example of a pattern M, which consists of a regular three-pointed star. An advantage of this particular pattern is that it allows neighboring patterns M to be interlaced with each other, so that the array of patterns is particularly compact within the surface of the carrier 1, as can be seen in FIG. 3c. The spatial resolution of the characterization of the electromagnetic radiation provided by the device 10 can thus be particularly fine.

Figure 3D:
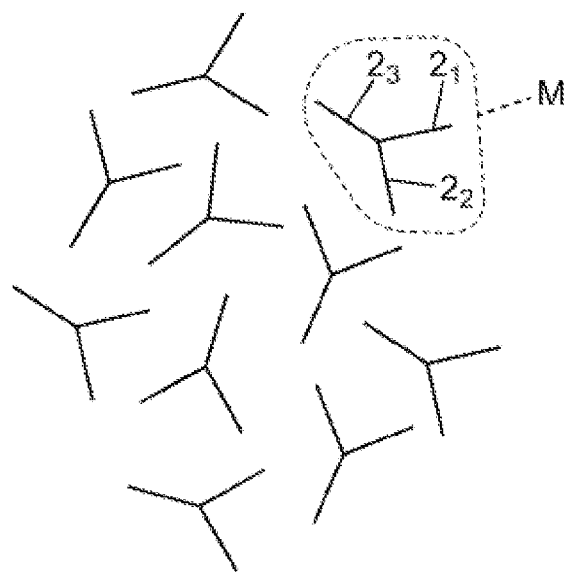

FIG. 3d shows yet another example of a pattern M, which is comprised of three branches arranged in a "Y". The branches of the pattern M are designated by the references $2_1$, $2_2$, and $2_3$. The patterns M may still be interlaced, but are randomly distributed and oriented within the surface of the carrier 1.

Figure 3E:
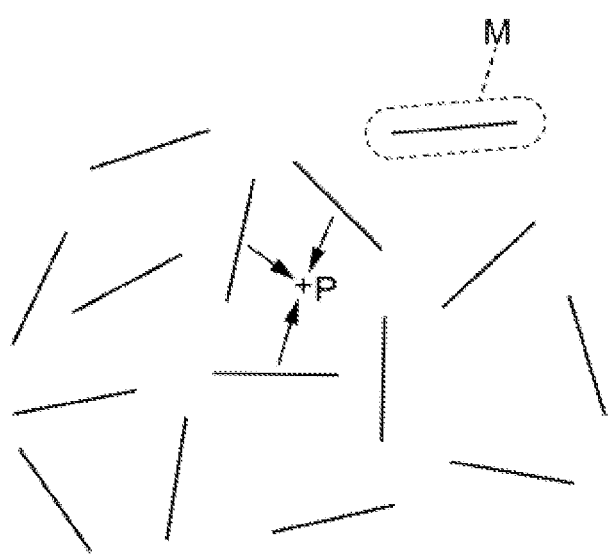

FIG. 3e shows yet another example of a device 10 in accordance with the invention, but in which each pattern M consists of a single rectilinear segment of sensitive material. The patterns M are again randomly distributed and oriented within the surface of the carrier 1. For such an embodiment of the invention, two or three patterns M adjacent to a point in the surface of the carrier 1, and whose orientations are different, are required in order to determine the polarization of the electromagnetic radiation which is incident to this point, apart from the direction of rotation of this polarization when it is circular or elliptical. In FIG. 3e, the patterns M to be used to determine the polarization of the electromagnetic radiation at point P are linked to this point by arrows.

The material which is sensitive to electromagnetic radiation, and which constitutes the rectilinear segments of each pattern M, may be an electrically conducting material made of metal, for example silver or copper, or weakly electrically conducting, such as an organic conducting material. Weakly electrically conducting material is understood to mean a material whose electrical conductivity value is less than $10^4$ S/m (siemens per meter), for example typically about 10 S/m to 500 S/m. It is known that the heating power caused by electromagnetic radiation in a conducting material is proportional to the square of the amplitude of the component of the electric field which is parallel to the rectilinear segment, and proportional to the electrical resistivity of the conducting material.

Alternatively, the material which is sensitive to electromagnetic radiation, and which constitutes the rectilinear segments of each pattern M, may be a dielectric material which exhibits losses by dielectric polarization, for example such as alumina ($Al_2O_3$), aluminum nitride (AlN), ruthenium ($RuO_2$) or nickel (NiO) oxides, iron phosphate ($LiFePO_4$), etc. In this case, and again as is known, the heating power caused by electromagnetic radiation is proportional to the square of the amplitude of the component of the electric field which is parallel to the rectilinear segment, and proportional to the imaginary part of the electric susceptibility of the sensitive material.

In another alternative, the material which is sensitive to electromagnetic radiation, and which constitutes the rectilinear segments of each pattern M, may be a magnetic material which exhibits losses by magnetic polarization. Such a material may be in particular of the ferromagnetic type, for example such as ferric oxide ($Fe_2O_3$). In this other case, and again as is known, the heating power caused by electromagnetic radiation is proportional to the square of the amplitude of the component of the magnetic field which is parallel to the rectilinear segment, and proportional to the imaginary part of the magnetic susceptibility of the sensitive material.

However, the power of the electromagnetic radiation is proportional to the square of the amplitude of the electric field, or equivalently of the magnetic field. Then, when the electromagnetic radiation is linearly polarized, the heating power of a rectilinear segment of the sensitive material is approximately proportional in all cases to the power of the electromagnetic radiation multiplied by the square of the cosine of the angle between the longitudinal direction of the rectilinear segment and the direction of the electric or magnetic field, depending on which of the fields, electric or magnetic, the material of the segment is sensitive to. In other words, the heating of a rectilinear segment of the sensitive material is approximately proportional to the square of the scalar product between the unit vector of the rectilinear segment and the electric or magnetic field, depending on which of these fields the material of the segment is sensitive to.

The patterns M of the sensitive material may be formed on the surface of the carrier 1 using a method of selective deposition known to those skilled in the art. For example, such a known method may make use of a mask, in which the openings determine the dimensions and position of each rectilinear segment of one of the patterns M on the carrier 1. Deposition of the sensitive material is then performed through the openings of the mask. Alternatively, the dimensions and position of each rectilinear segment of the pattern M may be determined by a method of selective attachment of the sensitive material, applied to locations distributed across the surface of the carrier 1. Such a method of selective attachment may comprise locally activating the material of the carrier 1 in order to produce an adhesion of the sensitive material on the carrier 1, or selectively depositing an attachment layer which is adapted to be adherent to the carrier 1, and also to be adherent to the sensitive material. In yet another alternative, a continuous layer of the sensitive material may first be formed on the surface of the carrier 1, then selectively etched using a laser or via a chemical process through a mask.

When the carrier 1 is based on an organic material, such as Kapton®, thermal degradation compounds of this organic material may constitute the sensitive material. In particular, these thermal degradation compounds may comprise particles of carbon graphite. The sensitive material thus obtained is electrically conducting with a low conductivity value. In this case, the patterns M of sensitive material can simply be obtained by locally and selectively heating the carrier 1 at the desired locations for the patterns M. Such local and selective heating may be carried out by means of a laser beam, by moving this laser beam to the desired locations for the patterns M at a movement speed appropriate for locally delivering the thermal power required to convert the organic material into sensitive material. Depending on the organic material selected to constitute the carrier 1, a person skilled in the art knows how to select the wavelength of the laser, its power, as well as the speed at which the laser is moved across the surface of the carrier 1, in order to obtain the sensitive material desired. The sensitive material thus obtained can be characterized by implementing one of the known methods of local material analysis, and one of the known methods of local measurement of electrical conductivity.

Figure 4:
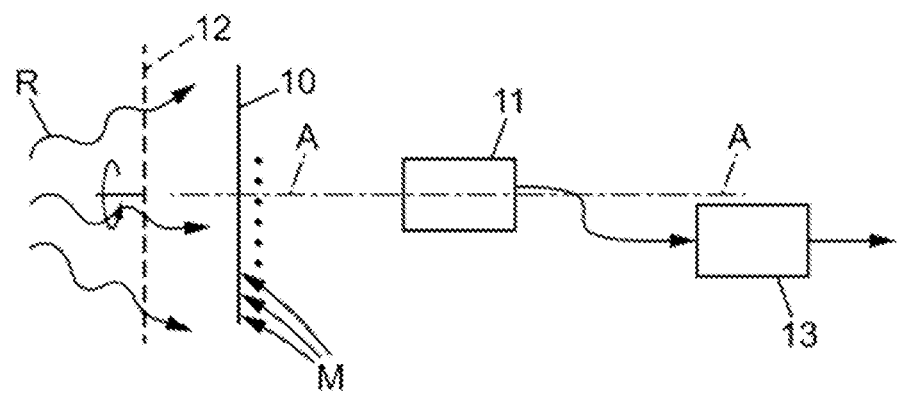
FIG. 4 illustrates a use of a device according to the invention, to reveal spatial variations in the polarization of an electromagnetic radiation.

FIG. 4 illustrates one possible implementation of the device 10. The device 10, for example in the form of a film which bears the patterns M of sensitive material, is placed in the electromagnetic radiation R to be characterized, and a thermal camera 11 is placed so as to capture infrared images of the surface of the carrier of the device 10 which bears the patterns M. Preferably, this surface which bears the patterns M of sensitive material may be turned towards the thermal camera 11. The thermal camera 11 may be one of the commercially available models, with an image sensor array sensitive to wavelengths between 3 μm and 5 μm, for example a sensor array of cooled InSb type. Preferably, the optical axis A-A of the camera 11 may be perpendicular to the surface of the carrier of the device 10 which bears the patterns M. In this manner, all of the patterns M of the device 10 can appear clearly in the infrared images captured by the camera 11.

When the electromagnetic radiation R is continuously incident on the device 10, it causes heating of some of the rectilinear segments of the patterns M, depending on the polarization of the radiation R and depending on the orientation of this polarization relative to each rectilinear segment. The rectilinear segments whose temperature thus increases under the effect of the radiation R then appear with higher intensities in the infrared images captured by the thermal camera 11. However, parasitic thermal phenomena such as thermal diffusion into the carrier 1, thermal diffusion into the air in contact with the surface of the carrier 1 which bears the patterns M, and thermal convection which can occur in the air near the carrier 1, tend to reduce the temperature differences generated by the radiation R between different rectilinear segments of the sensitive material, whether these segments belong to the same pattern M or to different patterns M, and between each rectilinear segment of the sensitive material and the carrier 1 outside the patterns M. The contrast in the infrared images captured by the thermal camera 11 is then reduced. According to an improvement of the invention which compensates for such a reduction in the contrast of the captured images, the electromagnetic radiation R which is incident on the device 10 may be modulated in intensity. Such modulation may be applied by the source of the radiation R when possible, or by a modulation system 12 which is arranged in the path of the radiation R before the radiation reaches the device 10. For example, the modulation system 12 may be a movable screen which has at least one opening, such as a wheel whose angular sectors are comprised of a material that is selectively opaque or transparent to the radiation R, and which is rotated by a motor at a controlled speed. The system 12 thus applies an intensity modulation to the radiation R which is incident on the device 10, at a frequency which may be between 1 Hz (hertz) and 100 Hz for example. The intensities of image points which are measured by the thermal camera 11 are then filtered by a synchronous detection system 13, in accordance with the modulation applied to the source of the radiation R or by the system 12. Such an image capture mode with synchronous detection makes it possible to suppress continuous thermal contributions which are produced by at least one of the parasitic thermal phenomena mentioned above. Typically, the modulated radiation R causes a series of successive pulses of temperature increases in some of the rectilinear segments of the patterns M of the device 10, and these pulses are selectively detected in the infrared images after filtering by the demodulation system 13.

Figure 5A:
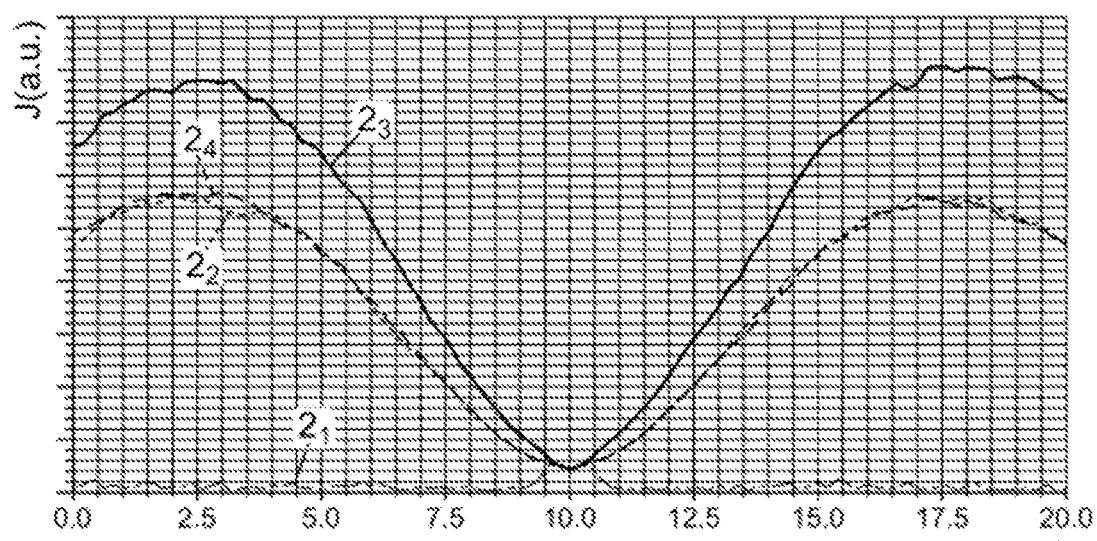

The diagram of FIG. 5a shows the distribution of the electric current density which is induced in a pattern M of the device 10, for a pattern as represented in FIG. 2a, when the electromagnetic radiation R which is incident on this pattern has a linear polarization of the electric field, parallel to rectilinear segment $2_3$. In the case of FIG. 5a, the sensitive material is a metal oxide whose electrical conductivity is approximately 1000 S/m, and the width of each of the segments $2_1$-$2_4$ is equal to 200 μm. The horizontal axis identifies the position along each of the segments $2_1$-$2_4$, from one end of each segment to the other for a segment length equal to 20 mm. This position is denoted x. The vertical axis identifies the magnitude of the current density, denoted J and expressed in arbitrary units (a.u.). The curve relating to each segment of the pattern M of FIG. 2a is labeled with the reference for this segment. As shown by the curves in the diagram of FIG. 5a, the current density induced in segment $2_3$ is the greatest, since this segment $2_3$ is parallel to the electric field of the radiation R; the current density induced in segment $2_1$ is substantially zero, because this segment $2_1$ is perpendicular to the electric field of the radiation R; and the current densities induced in segments $2_2$ and $2_4$ are intermediate and substantially equal, because the two segments $2_2$ and $2_4$ are each at 45° to the electric field. However, because of the highly conducting nature of the sensitive material, with a high electrical conduction value, a resonance appears within each of segments $2_2$-$2_4$, of the antenna effect type in receiver mode. Because of this resonance behavior, the curves relating to segments $2_2$-$2_4$ each show a peak in the magnitude of the induced current density. The local heating caused by the radiation R at each point of one of segments $2_1$-$2_4$ is proportional to the square of the magnitude of the current density which is induced at this point. Thus, in the infrared images captured by the thermal camera 11, the ends of segment $2_3$ appear the brightest; more precisely the portions of this segment which are located approximately 2.5 mm from each of its two ends appear brighter. Segments $2_2$ and $2_4$ each appear in the captured images similarly to segment $2_3$, but less bright, and segment $2_1$ appears dark according to the temperature of the carrier 1, except at its center where its temperature is increased due to thermal conduction from the portions close to the other segments $2_2$-$2_4$.

Figure 5B:
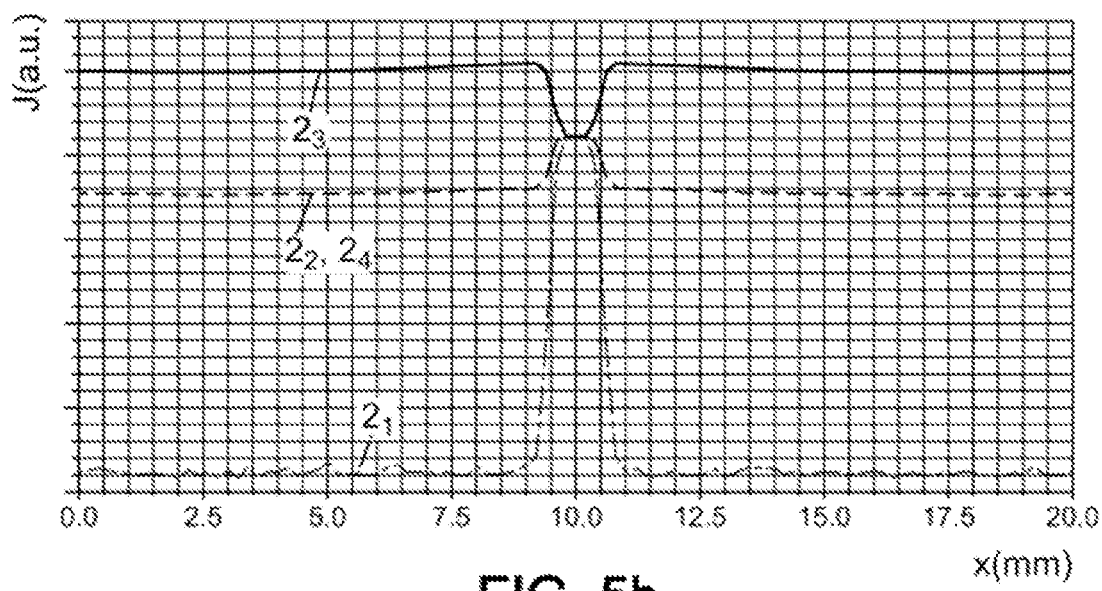

FIG. 5b corresponds to FIG. 5a where the sensitive material is still electrically conducting, but with a much lower electrical conductivity value, around 20 S/m. This value corresponds to a carrier 1 made of Kapton® which has been locally heated by laser to form the sensitive material. The resonance behavior no longer exists, so the magnitude of the electric current density induced in each segment is substantially constant outside of a limited area around the middle of that segment. As before, this magnitude of the induced current density depends on the orientation of the segment relative to the direction of linear polarization of the electric field of the radiation R. The elimination of an intersection between segments within a same star pattern, as introduced between FIG. 2b and FIG. 2c, prevents the center of the star from appearing highlighted in the captured infrared images.

Figure 6:
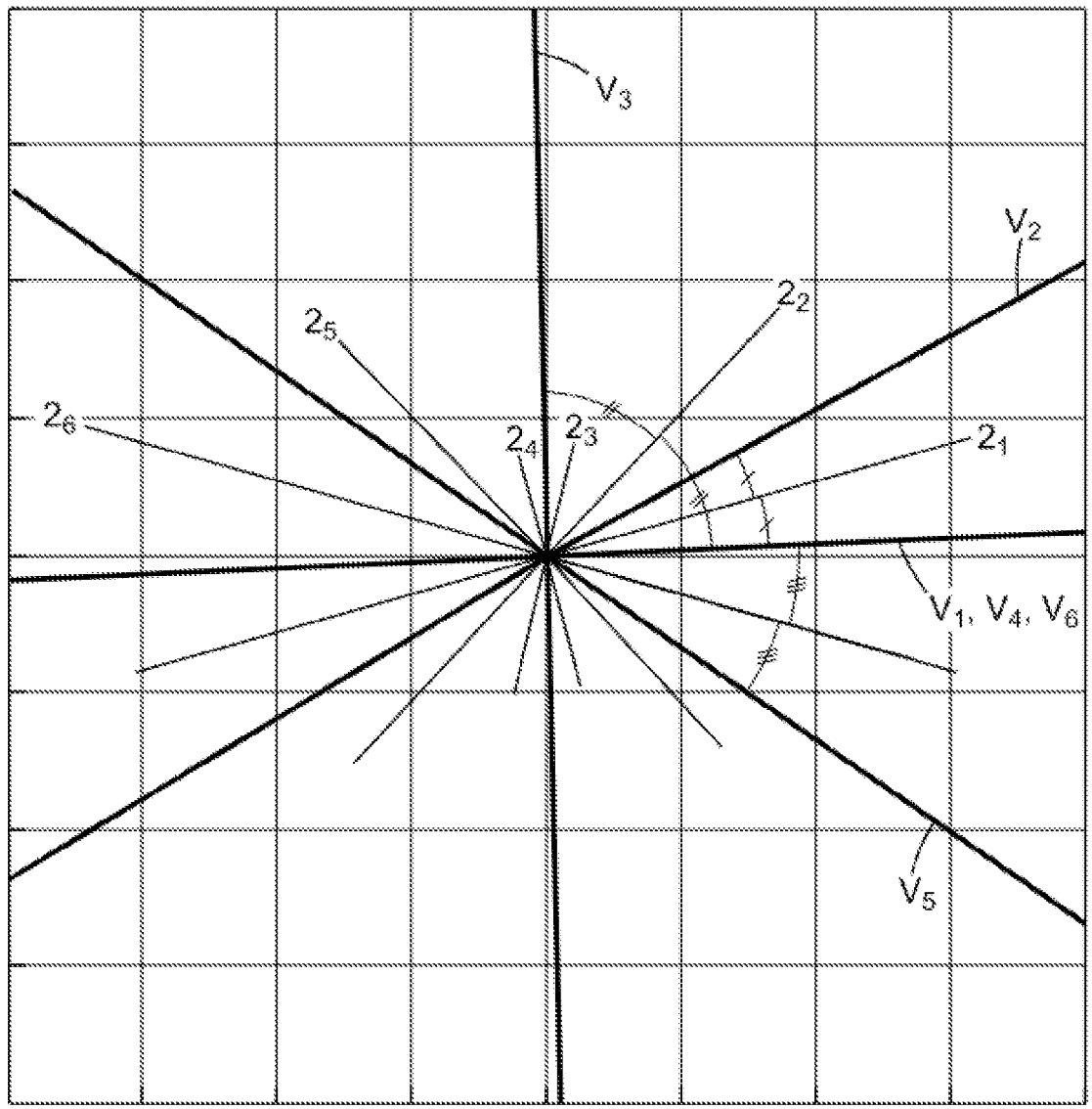
FIG. 6 illustrates a manner of determining a local direction of linear polarization of an electromagnetic radiation, using the device of FIG. 1 implemented with the pattern of FIG. 2b.

The diagram of FIG. 6 identifies, in a plane parallel to the surface of a carrier 1 which bears the pattern M of FIG. 2b, the directions of segments $2_1$-$2_6$ of the pattern. These directions appear in the diagram according to their respective actual orientations, and are labeled with the references for the corresponding rectilinear segments. Furthermore, each segment direction in the diagram of FIG. 6 is associated with a representative length which is proportional to the heating of the segment, as read in the infrared images captured by the thermal camera 11. Segments $2_1$ and $2_4$, which are perpendicular to each other in the example considered but this is not essential, form a first base of linear polarization. Similarly, segments $2_2$ and $2_5$ form a second base of linear polarization, and segments $2_3$ and $2_6$ form a third base of linear polarization. For each of these bases separately, the ratio of the lengths representative of the two segment directions of the base indicates two distinct directions which are possible for the linear polarization of the radiation R.

These two possible directions of polarization are symmetrical relative to the segment directions of the base. So, according to the first base (segments $2_1$ and $2_4$), the possible directions for the linear polarization of the radiation R are $V_1$ and $V_2$, as indicated in the diagram. These two possible directions of linear polarization are angularly closer to that of the segment directions of the base which corresponds to a greater rise in temperature (direction of segment $2_1$ in the example considered). Similarly, the directions that are possible for the linear polarization of the radiation R are $V_3$ and $V_4$ according to the second base (segments $2_3$ and $2_5$), and are $V_5$ and $V_6$ according to the third base (segments $2_3$ and $2_6$). The concordance between these possibilities which result separately from the three bases of linear polarization of the pattern M is the coincidence between directions $V_1$, $V_4$ and $V_6$. This direction of coincidence, $V_{1=}V_{4=}V_6$, is therefore the direction of linear polarization of the electromagnetic radiation R at the location of the pattern M considered. This example corresponds to the twelve-pointed star of FIG. 6, creating three orthonormal bases in the plane of the pattern M. The same reasoning applies to the eight-pointed star of FIG. 2a, creating two orthonormal bases which will therefore yield four potential directions of linear polarization, only two of which will be coincident with each other to indicate the actual direction of linear polarization. A three-pointed star pattern M where each arm is non-orthogonal to another, as represented in FIG. 3d, creates two non-orthogonal bases which will also yield four potential directions, two of which will be coincident with each other to indicate the actual direction of linear polarization. This reasoning generally applies to any N-pointed star pattern that defines at least three directions.

The method for determining the direction of linear polarization which has just been described with reference to FIG. 6 can be repeated independently for several of the patterns M of the device 10. The direction of linear polarization of the electromagnetic radiation R is thus determined at the locations of these patterns M, so that spatial variations in this polarization can be uncovered.

This method for determining polarization may also be applied in a case where the polarization of the electromagnetic radiation is elliptical at the location of the pattern M which is used. The orientation of the axes of the polarization ellipse is then obtained, as well as possibly a value for the quotient of the respective lengths of the major axis and minor axis of the polarization ellipse.

It is understood that the invention may be reproduced by modifying secondary aspects of the embodiments described in detail above, while retaining at least some of the advantages cited. In particular, patterns M which have arrangements of rectilinear segments of sensitive material which are different from those presented, may alternatively be used.

We also recall here that separate rectilinear segments of sensitive material may be used such that each constitutes a separate pattern, and such patterns with one segment per pattern may be distributed in a random array and each oriented randomly in or on the surface of the carrier.

In general, the patterns may have random orientations in a same device that is in accordance with the invention. Furthermore, they may be regularly or randomly distributed in or on the surface of the carrier, including randomly on a regular grid.

Furthermore, the reasoning that has been presented more particularly for an electrical conductor type of sensitive material can be transposed without difficulty to dielectric or magnetic sensitive materials.

Finally, all numerical values that have been cited have been cited for illustrative purposes only, and may be changed according to the application considered.

The invention claimed is:

1. A device suitable for revealing spatial variations in polarization of electromagnetic radiation, in a form of localized temperature variations,
   the device comprising a surface of a carrier which is thermally and electrically insulating, and comprising in or on the surface of the carrier, an array of patterns which each consist of at least one rectilinear segment of a material referred to as sensitive material,
   the sensitive material being suitable for producing heat when said sensitive material is exposed to an electric field or to a magnetic field of the radiation, with a value of a ratio of heating power to electromagnetic radiation power which varies according to the polarization of said electromagnetic radiation relative to an orientation of each segment in the surface of the carrier,
   said ratio of heating power to electromagnetic radiation power being substantially zero in the carrier outside of the segments of the sensitive material, regardless of the polarization of the radiation,
   wherein, if each pattern comprises several segments, these segments within each pattern have at least two different orientations, or wherein, if each pattern comprises only one segment, the segments of two neighboring patterns have different orientations,
   the array being comprised of repetitions of a basic pattern with offsets in several different directions of repetition in the surface of the carrier, so as to form a two-dimensional array of identical patterns,
   wherein the sensitive material is an electrically conducting material, with an electrical conductivity value of said sensitive material which is between 10 S/m and 500 S/m.

2. The device of claim 1, wherein each pattern comprises several rectilinear segments of sensitive material, and the segments of each pattern have at least three different orientations in the surface of the carrier, inside said pattern.

3. The device of claim 1, wherein the offsets of the repetitions of the basic pattern are combined in two different directions of repetition in the surface of the carrier, and are regular, so that the two-dimensional array of identical patterns is periodic in each of the two directions of repetition, with a spatial period in each of said directions of repetition which is between 100 μm and 50 mm.

4. The device of claim 1, wherein any two neighboring of the patterns in the surface of the carrier are interlaced with one another.

5. The device of claim 1, wherein the segments of any pair of neighboring patterns in the surface of the carrier are separated by an inter-pattern gap, which is devoid of sensitive material, between any one of the segments of a first pattern of the pair and any one of the segments of the other pattern of the pair.

6. The device of claim 1, wherein any two segments of a same pattern are insulated from each other by an intra-pattern gap which is devoid of sensitive material.

7. The device of claim 1, wherein each pattern is composed of N segments (2) arranged in the surface of the carrier, N being an integer between 3 and 16, the values 3 and 16 being included, and wherein the respective orientations of the N segments of any one of the patterns are uniformly distributed angularly.

8. The device of claim 7, wherein the segments of each of the patterns are arranged radially around a center of the pattern, so as to form a regular N-pointed star in the surface of the carrier.

9. The device of claim 1, wherein each segment has a length which is between 50 μm and 40 mm, and a width which is between 10 μm and 500 μm, said lengths and widths being measured parallel to the surface of the carrier.

10. The device of claim 1, wherein the surface of the carrier is comprised of an organic material which is thermally and electrically insulating, and wherein the sensitive material comprises at least one compound which results from an alteration of the organic material.

11. The device of claim 1, further comprising a thermal camera, arranged to capture infrared images of the surface of the carrier while said surface of the carrier is exposed to the electromagnetic radiation, so as to cause portions of at least some of the segments of sensitive material to appear in the captured images with intensities which depend on the respective temperature values of said segment portions.

12. The device of claim 11, further comprising:
a modulation system, which is arranged to apply a temporal modulation sequence to the electromagnetic radiation to which the surface of the carrier is exposed; and
a synchronous detection system, which is arranged to filter the intensities captured in successive images of the surface of the carrier, in accordance with the temporal modulation sequence.

13. A method for manufacturing a device suitable for revealing spatial variations in polarization of an electromagnetic radiation, said device being in accordance with claim 1, the method comprising the following steps:

providing a carrier, having a surface composed of a thermally and electrically insulating organic material; and
selectively heating the organic material in predefined zones of the surface of the carrier, so as to locally alter said organic material to form the sensitive material, in order to constitute the segments of sensitive material.

14. The device of claim 10, wherein the carrier is based on polyimide.

15. The device of claim 14, wherein the sensitive material comprises at least one compound which results from thermal degradation of the organic material.

16. The device of claim 3, wherein the spatial period in each of said directions of repetition which is between 1 mm and 30 mm.

17. The device of claim 9, wherein each segment has a length which is between 1 mm and 30 mm, and a width which is between 100 μm and 300 μm.

18. The device of claim 12, wherein in the step of selectively heating the organic material, the carrier has a surface composed of a material based on polyimide, and the organic material is locally altered by thermal degradation.

19. The device of claim 2, wherein the offsets of the repetitions of the basic pattern are combined in two different directions of repetition in the surface of the carrier, and are regular, so that the two-dimensional array of identical patterns is periodic in each of the two directions of repetition, with a spatial period in each of said directions of repetition which is between 100 μm and 50 mm.

20. The device of claim 2, wherein any two neighboring of the patterns in the surface of the carrier are interlaced with one another.

* * * * *